United States Patent [19]
Kent

[11] Patent Number: 4,891,573
[45] Date of Patent: Jan. 2, 1990

[54] EVANESCENT MODE TESTER FOR CERAMIC DIELECTRIC SUBSTRATES

[75] Inventor: Gordon D. Kent, Cazenovia, N.Y.

[73] Assignee: Dielectric Labs, Inc., Cazenovia, N.Y.

[21] Appl. No.: 177,475

[22] Filed: Apr. 1, 1988

[51] Int. Cl.[4] .............................................. G01R 27/04
[52] U.S. Cl. .................................. 324/58 R; 324/58 C
[58] Field of Search ................ 324/58 R, 58 C, 58.5 C

[56] References Cited

PUBLICATIONS

Kooi et al., "Measurement of Dielectric Loss Using a Cut-Off Circular Waveguide Cavity;" IEEE Transactions on Instrumentation and Measurement; vol. IM-29, No. 1, Mar. 1980, pp. 44-48.

Howell, A Quick Accurate Method to Measure the Dielectric Constant of Microwave Integrated-Circuit Substrates, IEEE Transactions on Microwave Theory and Techniques, Mar. 1973, p. 142.

Pannell et al., Two Simple Methods for the Measurement of the Dielectric Permittivity of Low Loss Microstrip Substrates, IEEE Transactions on Microwave Theory and Technique, Apr. 1981, p. 383.

Ginzton, Microwave Measurements, McGraw-Hill, 1957, p. 438.

Guillon et al., Complex Permittivity Measurement of MIC Substrate, Arch. fuer Elektron. und Uebertragungstech., pp. 102-104, Mar. 1981.

S. B. Cohn, K. C. Kelly-"Microwave Measurement of High-Dielectric Constant Materials;" Sep., 1966; vol. MTT-14, No. 9; IEEE Transactions on Microwave Theory & Techniques.

A. R. Gerhard, Measuring Dielectric Constant of Substrates for Microstrip Applications, IEEE Transactions on Microwave Theory and Technique, Jul., 1976, p. 485.

Napoli et al., A Simple Technique for the Accurate Determination of the Microwave Dielectric Constant, etc., IEEE Transactions on Microwave Theory and Technique, Jul., 1971, p. 664.

Lenzig, Measurement of Dielectric Constant of Ceramic Substrates at Microwave Frequencies, Ceramic Bulletin, vol. 51, No. 4, p. 361.

*Primary Examiner*—Reinhard J. Eisenzopf
*Assistant Examiner*—Anthony L. Miele
*Attorney, Agent, or Firm*—Wall and Roehrig

[57] ABSTRACT

A ceramic or other substrate is tested for dielectric constant K and loss tangent by placing it on a central transverse plane across a cylindrical waveguide. A swept-frequency signal is injected into the waveguide at an input coupling loop and is picked up at an output coupling loop. Maximum transmission through the dielectric substrate occurs at a frequency that depends on the waveguide radius, the substrate thickness, and the dielectric constant. The dielectric constant can be obtained from the resonant frequency of a predetermined transmission mode, e.g., the $TE_{01}$ mode. The loss tangent can be calculated from the transmission bandwidth. The measurement of the dielectric constant is insensitive to the position of the substrate in the gap between waveguide sections, and thus intimate contact is not required.

11 Claims, 3 Drawing Sheets

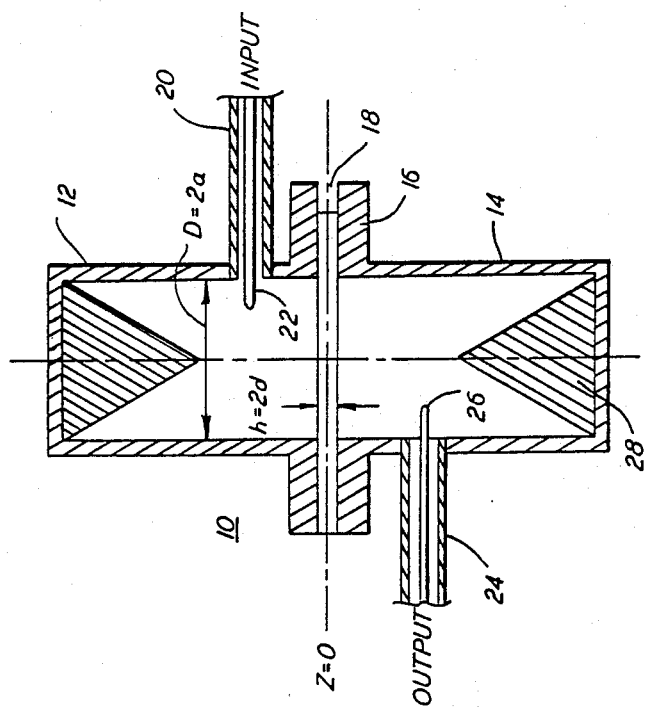
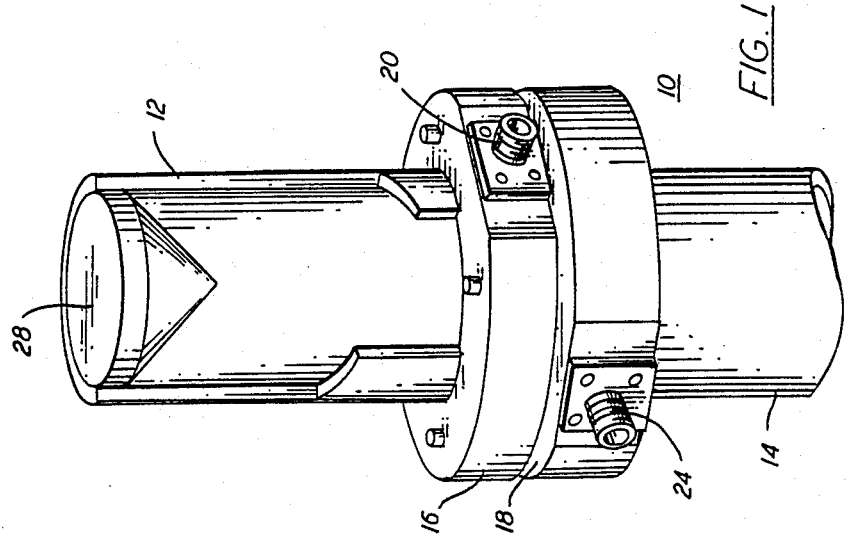

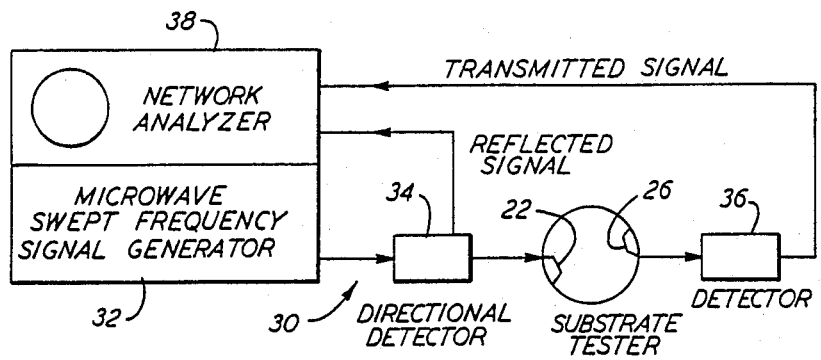
FIG. 3
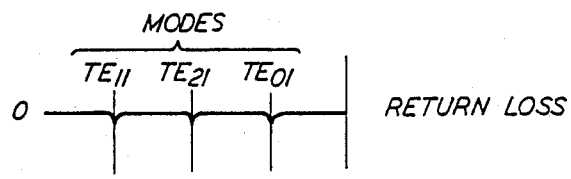
FIG. 4A
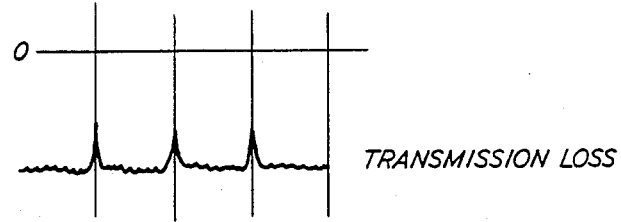
FIG. 4B
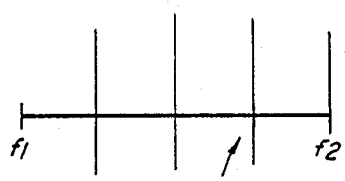
FIG. 4C  $f_0$ = FREQUENCY OF (EVEN) $TE_{01}$ MODE

EVANESCENT MODE TESTER FOR CERAMIC DIELECTRIC SUBSTRATES

BACKGROUND OF THE INVENTION

This invention relates to the measurement of material properties and is more particularly directed to the non-destructive testing of substrates for microwave circuits to determine their dielectric constant.

Precise knowledge of the dielectric constant and loss tangent of ceramic substrates is essential to the design of microstrip and integrated microwave circuits. Accordingly, accurate measurement methods are required by the circuit designer and by the substrate manufacturer as well. For both, the simplicity and convenience of the method of measuring are important, but the user and producer may judge the merits of these measurements differently.

Methods proposed previously require intimate contact between the dielectric and some conducting circuit electrode. Such contact may be achieved either by metallization or by pressing a circuit formed on a soft substrate against the ceramic. With metallization of two or all six sides of the substrate to form a cavity resonator, the dielectric constant and loss tangent can be calculated from frequency and quality factor (Q) data. Other procedures, also dependent on metallization, derive their results from measurements on specially fabricated circuits or from circuits such as microstrip lines that may be provided by the manufacturer.

These methods are a compromise between convenience and accuracy. In the methods that require metallization, convenience for the user depends largely on the metallization pattern supplied by the manufacturer. For the producer of unmetallized substrates, metallization is a costly and inconvenient requirement. Since this metallization is an irreversible process that wastes substrates, it is suited only for sampling a production run.

The method involving pressure contact with a circuit on a soft substrate is more suited for production-run testing, although it requires calibration with a standard substrate.

OBJECTS AND SUMMARY OF THE INVENTION

It is an object of this invention to provide a convenient and effective technique for testing a ceramic substrate for its complex dielectric constant, but without encountering the above-mentioned drawbacks of the prior art.

It is a more particular object of this invention to provide a testing technique in which metallization of the substrate is not required.

It is another object to provide a testing technique that does not depend on intimate contact of testing equipment with the substrate.

In accordance with an aspect of this invention, a sheet of the substrate is placed across a section of waveguide of circular cross section, and a $TE_{01}$ waveguide mode is used to probe the substrate. At a particular frequency ($f_0$) of maximum transmission across the substrate, defined as a resonance, the electric field is even with respect to the axial coordinate with origin at the center of the substrate. This resonance frequency is close to the $TE_{01\delta}$ mode frequency of a dielectric resonator of diameter $2a$ and a height $2d$. From measurements of $f_0$, the transmission band width $\Delta f$, the height, and the diameter, the dielectric constant and loss tangent can be calculated.

This resonance frequency is below cutoff in the circular waveguide adjacent to the substrate but above cutoff in the circular portion of the substrate. In the portion of the substrate that extends in the gap beyond the waveguide radius, the fields of all modes excited in this radial waveguide are rapidly evanescent. Since there are no electric field lines normal to the surface of the substrate, there is no need for intimate contact of the substrate to the two surfaces of the gap. The small effect of the gap can be taken into account as part of the calculation of the dielectric constant.

The test apparatus comprises a length of circular waveguide with a holder for the substrate dividing the length into upper and lower (or left and right) sections. There is a signal injection probe on one side of the holder for injecting a frequency swept signal and a signal extraction probe on the opposite side of the holder for sampling the signal so that maxima (or minima) can be measured as the signal frequency is swept. Preferably, there are non-reflecting terminations in the ends of the upper and lower waveguide sections, but these are not strictly necessary.

This technique seeks out modes that resonate in the disc of dielectric material that spans the waveguide holder. Modes that propagate or are evanescent both in the empty portions of the waveguide and in the dielectric need not be considered; the terminations at the ends eliminate any narrow band resonance phenomena. It is assumed as well that a mode that is evanescent in the waveguide, but propagates in the dielectric, is evanescent in the radial waveguide in the gap beyond the radius a. This justifies use of a conducting-wall boundary condition at a radius $r=a$ in the dielectric. The error that follows from this approximation can be estimated by a perturbation calculation. The error is under about one percent of the value of the dielectric constant.

Boundary conditions at the dielectric surfaces lead to eigenvalue equations, namely $$(\theta \sin \theta - \gamma \cos \theta)(\theta \cos \theta + \gamma \sin \theta) = 0 \quad (1)$$ for TE modes, and $$(\theta \sin \theta - K\gamma \cos \theta)(\theta \cos \theta + K\gamma \sin \theta) = 0 \quad (2)$$

for TM modes. For reasons that become more apparent later, only TE modes are significant for testing. The notation is defined as follows:

$$\theta^2 = K\theta_0^2 - \theta_c^2; K = (\epsilon'/\epsilon_0), \quad (3)$$

$$\gamma^2 = \theta_c^2 - \theta_0^2 \quad (4)$$

$$\theta_c = (x_{lm} d/a) \quad (5)$$

$$\theta_0 = (\omega d/c) \quad (6)$$

where $\omega = 2\pi f$, being the resonant frequency, and c is the velocity of light. For a $TE_{lm}$ mode, $x_{lm}$ is the m'th zero of the derivative of the Bessel function J A; for a $TM_{lm}$ mode, $x_{lm}$ is the m'th zero of J A. For the preferred $TE_{01}$ mode, $X_{01} = 3.832$.

If a resonance exists, the quantity $\gamma^2$ in equation (4) is positive, and either equation (1) or equation (2) has a solution for $\theta$ in terms of $\gamma$. As the quantities $X_{lm}$, d, a, and c are known, and the resonance frequency $\omega = 2\pi f$ is observed, the dielectric constant K can be calculated from equation (3).

In both equations (1) and (2), the first term is zero for even modes, and the second term is zero for odd modes. For the reasonable constraints of $K<100$ and $(d/a)<0.05$, there are no odd mode solutions. The effect of the dielectric substrate on TM modes is relatively small, and the even mode TM resonance frequencies are close to their cutoff frequencies. For the $TE_{01}$ and $TM_{11}$ modes, which have the same cutoff frequency, the substrate produces a wide separation between the two even resonances.

The modes one expects to observe in order of increasing frequency are $TE_{11}$, $TE_{21}$, $TE_{01}$, $TE_{31}$, .... With small coupling loops in the transverse plane, coupling to the TM modes is very weak. The resonances of the first four TE modes are well separated and easily identified. Any of these frequencies can be used to calculate the dielectric constant K. However, the $TE_{01}$ mode frequency gives the most reliable results. The relation between the dielectric constant K and this frequency will be described in detail later.

At resonance of the $TE_{01}$ mode, the reciprocal D of the unloaded quality factor $Q_0$ becomes $$(1/Q_0) = [(\epsilon''/\epsilon') + (\delta/a)(\theta_c/\theta_0)^2 U]/[1+U], \quad (7)$$

where $\delta$ is the waveguide skin depth, $(\epsilon' - j\epsilon'')$ is the complex permittivity of the substrate, and $$U = [1/K][\theta \cos^3\theta]/[\theta + \sin\theta \cos\theta)\sin\theta]. \quad (8)$$

The quantity U is the ratio of the electric energy in the waveguide to that in the substrate. This quantity U increases rapidly as the cutoff frequency is approached and as K decreases. The quantity U is insensitive to the ratio of thickness to diameter (d/a) over its practical range. The contribution to $(1/Q_0)$ from conductor losses, represented by the second term in the numerator of equation (7), cannot be made negligibly small, and it cannot be measured at the correct frequency in any simple way. Calculations of that term, using the bulk conductivity of brass, show that it increases more or less as the root of the cutoff frequency.

Three sources of error in the determination of the dielectric constant K are uncertainties in the measurement of a, d, and f. These are approximated by the following expressions:

$$(\Delta K/K)_a = -2(\theta_c/\theta_0)^2 (U + 1/K)(\Delta a/a), \quad (9)$$

$$(\Delta K/K)_d = (-2/K)(\theta/\theta_0)^2 \frac{1}{1 + \sin 2\theta/2\theta} \frac{\Delta d}{d} \quad (10)$$

$$(\Delta K/K)_{\theta_0} = -2(1 + U)(\Delta \theta_0/\theta_0). \quad (11)$$

where $\Delta a/a$ and $\Delta d/d$ are uncertainties in the measurements of radius a and dielectric substrate thickness d, and $\Delta \theta_0/\theta_0$ is the frequency error in terms of the quantity $\theta_0$. All these error coefficients are of the order of one to five. The largest error component is likely to be the frequency error coefficient; fortunately, the frequency can be accurately measured. The error from these sources can be kept below one percent.

A fourth source of error arises from the assumption that the electric field in the substrate is zero at a radius $r=a$. This can be estimated as a frequency perturbation produced by removing the stored energy of the evanescent modes in the radial space beyond the waveguide, i.e., where $r>a$. The approximate result is $$(\Delta K/K) = (4/\pi K)(\theta_c/\theta_0)^2 [1 - K(2\theta_0/\pi)^2]^{-\frac{1}{2}} (d/a). \quad (12)$$

The approximation is made by truncating the Fourier expansion in evanescent modes and equating the remaining coefficient to its asymptotic form. The validity of this approximation depends on the smallness of the ratio (d/a). For practical parameter values, $\theta K(d/a) \sim 0.25$, and an overestimate of equation (12) gives $$(\Delta K/K) \infty 10(d/a)^2. \quad (13)$$

Errors from this source can be kept below one percent and typically about 0.3%, unless (d/a) and K are unusually large. This error will be referred to as "gap" error.

Using several testers of differing radii, the $TE_{01}$ mode can be measured over some band of frequencies. The maximum radius is limited by the width of the substrate. The minimum radius is determined by available instrumentation and the maximum permissible value of (d/a). With a range of waveguide diameters, it is possible to span an octave.

Many resonances can be observed as maxima in the transmission through the test substrate. The lower modes can be identified by assuming a mode index, and assessing that assumption by the corresponding calculated value of the dielectric constant. If the assumed mode index is erroneous, the calculation yields a dielectric constant far removed from the expected value. The modes thus identified, in order, are $TE_{11}$, $TE_{21}$, $TE_{01}$, $TE_{31}$, $TE_{41}$, $TE_{12}$, $TE_{51}$ and $TE_{02}$. All modes are even with respect to the waveguide axis. No TM modes have been identified. The calculations of dielectric constant K from these resonant frequencies give values that are too low for all but the $TE_{01}$ and $TE_{02}$ modes. The latter modes are also characterized by the insensitivity of the resonance frequency to movement of the substrate. Thus, if the $TE_{01}$ mode resonance is used, the substrate can fit loosely in the holder, as neither movement in the axial direction nor in the transverse direction has a significant effect. Although the $TE_{02}$ mode gives good data, it is too close in frequency to other modes to be identified with great certainty. The $TE_{01}$ mode is always well separated and identifiable as the third resonance in the sequence.

The "gap" error can be easily computed from equation (12). Without the correction the apparent dielectric constant K is too large by a small amount, typically 0.3 to 0.5 percent.

The above and many further objects, features and advantages of this invention will be more fully understood from the ensuing description of a preferred embodiment, to be considered in connection with the accompanying drawing.

BRIEF DESCRIPTION OF THE DRAWING

FIG. 1 is a partly cut away perspective view of an evanescent mode substrate tester according to a preferred embodiment of the invention.

FIG. 2 is a schematic cross section of the substrate tester of FIG. 1.

FIG. 3 is a schematic block diagram of apparatus for testing a substrate and incorporating the tester of FIG. 1.

FIGS. 4A, 4B and 4C are plots showing microwave frequency resonances in the substrate testing apparatus of FIG. 3.

DETAILED DESCRIPTION OF A PREFERRED EMBODIMENT

Figure 5:
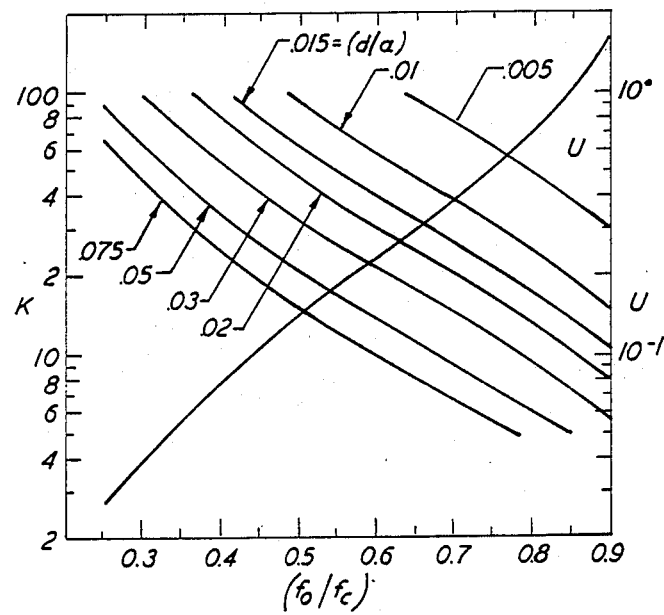
FIG. 5 is a chart showing curves of dielectric constant versus resonance-to-cutoff ratio, for various values of substrate thickness to waveguide diameter (d/a), and also showing the behavior of energy ratio U for changes in resonance-to-cutoff.

With reference to the Drawing, and initially to FIGS. 1 and 2, a substrate tester 10 comprises an upper section 12 and a lower section 14 of the circular waveguide with flanges that serve as holder 16. A sheet of dielectric substrate is to be disposed in the holder across the waveguide axis between the two sections 12,14. The waveguide has a radius a, i.e., a diameter 2a. The holder 16 has a slot 18 to receive flat ceramic substrate of a height h=2d, where d is the half-thickness of the substrate. An input port 20 provides means for signal injection through the wall of the waveguide section 12 above the slot 16. The input port 20 has a horizontal or transverse coupling loop 22 extending from the center conductor to ground.

Below the slot 16 is an output port for extracting the signal from within the lower waveguide section 14. The output port 24 has a horizontal coupling loop 26 also extending from the center conductor thereof to ground.

Absorptive terminations 28 are optionally included at the ends of the sections 12 and 14 away from the slot 16. The terminations 28 can be omitted, as standing wave resonances resulting from either an open or closed end of the sections 12 and 14 will generally be far removed from the resonance frequencies of the $TE_{01}$ and $TE_{02}$ modes of interest.

A test apparatus set-up 30 is shown in the schematic of FIG. 3, and includes a swept frequency microwave signal generator 32 which feeds a test signal through a directional detector 34 to the input coupling loop 22 of the tester 10. Another detector 36 is coupled to the extraction coupling loop 26 of the tester 10 and detects the level of signal transmitted through the substrate. The directional detector 34 provides an output corresponding to the level of the reflected signal to a network analyzer 38, while the detector 36 provides an output corresponding to the amplitude of the transmitted signal.

As shown in FIGS. 4A and 4B, the resonant frequencies of the reflected signal from detector 34 and the transmission peak resonances from the detector 36 are recognized by the analyzer 38 and the $TE_{01}$ mode resonance is easily recognized as the third lowest resonance, and can be verified by means of its insensitivity to motion of the substrate being tested. The frequency $f_0$ of this resonance is readily measured with great accuracy. The values of d and a also being known, the dielectric constant K can be computed by means of a straightforward algorithm that follows from equations (1), (3), (4), (5), and (6). A correction for the small gap error can readily calculated employing an algorithm based on equation (12).

FIG. 5 shows various curves of dielectric constant K versus the ratio of $TE_{01}$ mode resonant frequency $f_0$ to cutoff frequency $f_c$. Here, the ratio of dielectric thickness d to the waveguide radius a is the selected parameter for each of these curves.

Also shown in FIG. 5, as the curve with the rising slope, is a plot of energy ratio U vs. ratio of resonance frequency to cutoff; here for a value d/a of 0.03.

These curves indicate excellent behavior of the tester for all ratios of $f_0/f_c$ over a range of about 0.4 through 0.8.

The dependency of resonant frequency $f_0$ to dielectric constant K can also be seen from FIG. 5. As here illustrated, the electric energy ratio U increases rapidly either as cutoff is approached or as K decreases. However, the ratio U is relatively insensitive to the ratio d/a over its practical range.

Figure 6:
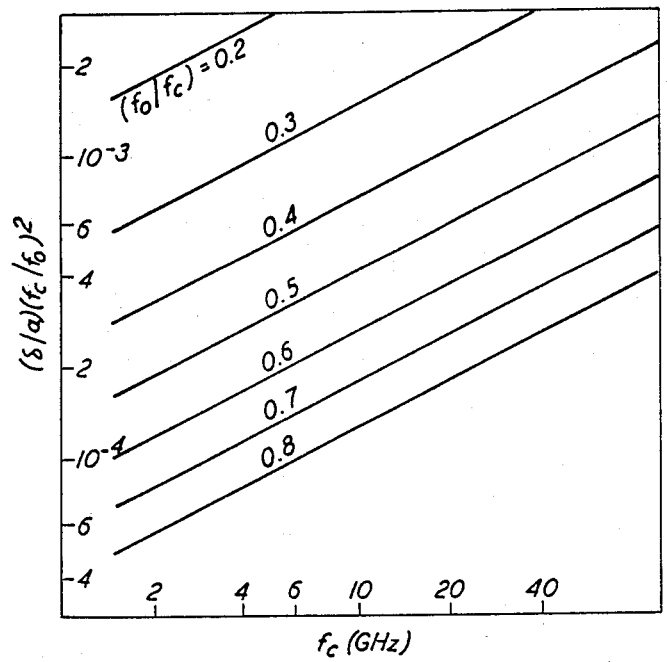
FIG. 6 is a chart showing plots of a parameter based on waveguide skin depth in brass versus cutoff frequency for various conditions.

The reciprocal of unloaded quality factor ($1/Q_0$), as expressed in equation (7), has a contribution from conductor losses in the waveguide. This is represented by the second term in the numerator of equation (7), and this loss cannot be made negligibly small. Moreover, the conductor losses cannot be measured accurately while at the resonance frequency. However, a plot of conductor losses for brass, as in FIG. 6, indicates that this contribution increases generally as the square root of cutoff frequency. The plot of FIG. 6 supplies values which can be employed, by means of suitable algorithm, in calculation of the loss tangent ($\epsilon''/\epsilon'$) of the substrate.

A practical version of this tester has been employed with the results as described below.

In order to assess the error that comes from the extension of the substrate beyond the radius of the waveguide (gap effect), two measurements were made on a substrate of nominal dielectric constant of K=38 and thickness of 0.0385 inches. For the first measurement, the substrate was square (2"×2") extending outside the 1.5 waveguide diameter. For the second, a circle was cut from the center to fit inside the tester. The results of these measurements are shown in Table I. The gap produces an apparent increase in the value of the dielectric constant K, as is to be expected from the inductive property of the gap fields. The fractional error ($\Delta K/K$) is as close to that predicted by equation (12) as can be expected from truncated calculations. Moreover, the somewhat loose fit of the circular substrate into the waveguide tends to increase the frequency and lower the calculated dielectric constant K.

The results of measurements on a variety of substrate materials and sizes are shown in Table II. Since only the $TE_{01}$ mode is used, the frequency of measurement is increased by decreasing the tester diameter. The resulting increase in the ratio of (d/a) also increases the gap effect and the apparent dielectric constant. The bottom line is the calibration at 1 MHz obtained by a bridge measurement. For this, the substrate is metallized and a circular electrode is formed by etching a circular gap.

The gap error is illustrated in the first and last columns by the values designated K* that are corrected according to equation (12). The correction is less than one percent, except for the entry in the last row, last column.

A positive error in the thickness measurement produces a
positive error in the dielectric constant $\theta K$ calculated from the capacitance data, but the error from the frequency calculation is negative. Since both error coefficients are of order one, the discrepancy between the calculated dielectric constant K values is approximately twice the error in the thickness measurement 2d. If the dielectric constant K is strictly independent of frequency, the thickness error can be reduced by taking the geometric mean of tester and bridge values. This procedure applied to the leftmost column yields $K=9.895\pm0.005$ as the corrected average.

The error in the loss tangent ($\epsilon''/\epsilon'$) that results from uncertainty in the effective conductivity of the waveguide can be minimized by using low-loss material and choosing the frequency range so that the energy ratio U is far less than unity. Measurement and calculations from equation (7) for the K38 material of row one, column six of Table II give $$(\epsilon''/\epsilon')=(2.65)[1\pm(0.11)(\Delta\sigma/\sigma)]10^{-4} \qquad (14)$$

Evidently, even a ten percent uncertainty in conductivity produces an uncertainty of only one percent on ($\epsilon''/\epsilon'$).

This technique for testing substrates is at least as simple and accurate as any other procedure that has been reported in the literature. The technique can be used to explore nonuniformities, providing the substrate is large. As there is no metallization, and as a loose fit in the tester is permissible, this tester can be used to advantage for production-line testing.

While this invention has been described in detail with reference to a preferred embodiment, it should be recognized that the invention is not limited to that embodiment. Rather, many modifications and variations thereof would be apparent to those of skill in the art without departing from the principles of this invention, as defined in the appended claims.

TABLE I

| | | GAP EFFECT | | | |
|---|---|---|---|---|---|
| Waveguide diameter (cm) | Substrate thickness (cm) | K Calculated with gap | K Calculated w/o gap | Error in K | ΔK, from Eq. (12) |
| 3.810 | 0.0980 | 38.1 | 37.9 | .005 | .003 |

TABLE II

| | MEASURED VALUES OF K FOR VARIOUS MATERIALS AND THICKNESSES | | | | | | | | |
|---|---|---|---|---|---|---|---|---|---|
| | | | | | Material | | | | |
| | K10 | P125 | | K38 | | NPO | | K70 | NPO |
| | | | | | Substrate Thickness | | | | |
| | 0.0632 (cm) | 0.02336 | | 0.0648 | | 0.1282 | | 0.1004 | |
| | | | | | f (GHz) K | | | | |
| waveguide diameter | f | K K* | f | K | f | K | f | K | f | K K* |
| 3.82 (cm) | 8.59 | 9.83 9.80 | 7.83 | 38.1 | 5.63 | 38.3 | 4.29 | 38.3 | 3.65 | 68.1 67.7 |
| 3.21 | 9.91 | 9.86 9.82 | 8.88 | 38.4 | 6.26 | 37.9 | 4.75 | 38.3 | 4.03 | 68.1 67.7 |
| 2.60 | 11.7 | 9.82 9.78 | 10.29 | 38.5 | 7.10 | 38.4 | 6.30 | 38.5 | 4.54 | 68.2 67.8 |
| 1.38 | 14.3 | 9.84 9.77 | 12.31 | 38.5 | 8.32 | 38.5 | 7.10 | 38.4 | 5.29 | 68.3 67.5 |
| Bridge | 1 (MHz) | 10.00 | | | | | 1 (MHz) | 38.1 | 1 (MHz) | 67.3 |

K* is the value corrected with Eq. (12) for the gap error

What is claimed is:

1. An evanescent mode tester for measuring the dielectric constant of a ceramic substrate comprising:

a length of waveguide of a predetermined inner diameter 2a defining a cutoff frequency below which said waveguide will not propagate electromagnetic energy;

a holder disposed at a center of said length of waveguide for holding a sheet of said substrate whose dielectric constant K is to be measured, such that the substrate extends across and beyond the diameter of the waveguide, said substrate having a predetermined thickness 2d;

signal injection means for injecting a frequency-swept signal into said waveguide at one side of said holder, said signal injection means sweeping through a range of frequencies below said cutoff frequency; and signal extraction means disposed in said waveguide at one or the other side of said holder for detecting the frequency-swept signal in said waveguide;

wherein said dielectric constant is calculated from the relationship of said diameter 2a, said thickness 2d, a resonant frequency and bandwidth of transmission of said injected signal through said substrate, and said cutoff frequency.

2. An evanescent mode tester according to claim 1 in which said waveguide is cylindrical.

3. An evanescent mode tester according to claim 1 further comprising a microwave swept-frequency signal generator having an output, directional means having an input coupled to said signal generator output, a first output coupled to said signal injection means for passing thereto the frequency-swept signal from the output of said generator and a second output providing a reflected signal from said signal injection means; a signal detector having an input coupled to the signal extraction means and an output, and a network analyzer having first and second inputs coupled respectively to the second output of the directional means and to the output of the signal detector, for indicating resonant frequencies of the swept-frequency signal.

4. An evanescent mode tester according to claim 1 wherein said holder creates a gap of a predetermined gap width to accommodate the thickness 2d of said substrate, and said dielectric constant K is calculated with a correction factor (ΔK/K) based on said gap width.

5. An evanescent mode tester according to claim 1 further comprising non-reflecting terminations disposed in each side of said waveguide beyond the positions of said signal injection means and said signal extraction means.

6. An evanescent mode tester for measuring the dielectric constant of a ceramic substrate comprising
   a length of waveguide of a predetermined inner diameter 2a;
   a holder disposed at a center of said length of waveguide for holding a sheet of said substrate whose dielectric constant K is to be measured, such that the substrate extends across and beyond the diameter of the waveguide, said substrate having a predetermined thickness 2d;
   signal injection means for injecting a frequency-swept signal into said waveguide at one side of said holder;
   signal extraction means disposed in said waveguide at one or the other side of said holder for detecting the frequency-swept signal in said waveguide;
   wherein said signal injection means and said signal extraction means each include a loop disposed in a plane parallel to said ceramic substrate; and
   wherein said dielectric constant is calculated from the relationship of said diameter 2a, said thickness 2d, a resonant frequency and bandwidth of transmission of said injected signal through said substrate, and a cutoff frequency below which said waveguide will not pass said signal.

7. A method of non-destructive testing of a dielectric substrate to measure a dielectric constant K and loss tangent thereof without metallization of a substrate, the method comprising finding the thickness 2d of the substrate; placing said substrate in a transverse gap that extends across a waveguide of a predetermined diameter 2a, which defines a cutoff frequency for the waveguide below which the waveguide will not propagate electromagnetic energy; the waveguide having a signal injection electrode on one side of said gap and a signal extraction electrode within the waveguide; applying a frequency-swept microwave signal to said injection electrode said signal sweeping through a range of frequencies below said cutoff frequency, the signal within said waveguide at least partly passing through said substrate; picking up the signal within said waveguide at said signal extraction means; finding a resonance frequency $f_0$ of the picked-up frequency-swept signal that corresponds to a predetermined known evanescent mode; and calculating the complex dielectric constant based on the diameter 2a of the waveguide, the thickness 2d of the substrate and the resonance frequency $f_0$ and bandwidth of said mode.

8. The method of claim 7 wherein said mode is the $TE_{01}$ mode.

9. The method of claim 7 further comprising correcting for discontinuity in the waveguide at a gap where said substrate is situated by a correction factor approximation $\Delta K/K$ which depends on the waveguide radius a and the substrate thickness 2d.

10. The method of claim 7 in which said waveguide is circular.

11. A method of non-destructive testing of a dielectric substrate to measure a dielectric constant K and loss tangent thereof without metallization of the substrate, the method comprising finding the thickness 2d of the substrate; placing said substrate in a transverse gap that extends across a waveguide of a predetermined diameter 2a; the waveguide having a signal injection electrode on one side of said gap and a signal extraction electrode within the waveguide; applying a frequency-swept microwave signal to said injection electrode, the signal within said waveguide at least partly passing through said substrate; picking up the signal within said waveguide at said signal extraction means; finding a resonance frequency $f_0$ of the picked-up frequency-swept signal that corresponds to a predetermined known evanescent $TE_{01}$ mode; and calculating the complex dielectric constant based on the diameter 2a of the waveguide, the thickness 2d of the substrate and the resonance frequency $f_0$ and bandwidth of said $TE_{01}$ mode; wherein said resonance frequency is the third maximum of transmission in order of increasing frequency.

* * * * *